United States Patent [19]

Santangelo et al.

[11] Patent Number: 5,302,549
[45] Date of Patent: Apr. 12, 1994

[54] METAL-SEMICONDUCTOR OHMIC CONTACT FORMING PROCESS

[75] Inventors: Antonello Santangelo, Belpasso CT; Carmelo Magro; Guiseppe Ferla, both of Catania CT; Paolo Lanza, Cassaro SR, all of Italy

[73] Assignee: SGS-Thompson Microelectronics S.r.L., Milan, Italy

[21] Appl. No.: 960,293

[22] Filed: Oct. 13, 1992

Related U.S. Application Data

[63] Continuation of Ser. No. 651,622, Feb. 7, 1991, abandoned.

[30] Foreign Application Priority Data

Feb. 20, 1990 [EP] European Pat. Off. ........ 90830063.5

[51] Int. Cl.$^5$ ................. H01L 21/265; H01L 21/283; H01L 21/324
[52] U.S. Cl. ..................................... 437/188; 437/20; 437/187; 437/247; 437/918; 148/DIG. 1
[58] Field of Search ............... 437/186, 187, 192, 200, 437/918, 188, 247, 20; 148/DIG. 154, DIG. 1

[56] References Cited

U.S. PATENT DOCUMENTS

| | | | |
|---|---|---|---|
| 4,012,235 | 3/1977 | Mayer et al. | 148/DIG. 154 |
| 4,135,292 | 1/1979 | Jaffe et al. | |
| 4,891,328 | 1/1990 | Gris | |
| 4,902,639 | 2/1990 | Ford | 437/58 |

FOREIGN PATENT DOCUMENTS

| | | | |
|---|---|---|---|
| 1120607 | 3/1982 | Canada | |
| 0012324A1 | 6/1980 | European Pat. Off. | |
| 2-114560 | 4/1990 | Japan | 437/918 |
| 2159662A | 12/1985 | United Kingdom | |

OTHER PUBLICATIONS

"Contact Metallurgy Development for VLSI Logic", Robert M. Geffken et al., *IBM Journal of Research and Development*, Nov. 1987, vol. 31, No. 6, pp. 608-616.
"Properties of Reactive Sputtered TiW" R. A. M. Wolters et al.; *Solid State Technology*, Feb. 1986; pp. 131-136.
"Palladium Silicide Contact Resistance Stabilization By Ion Implantation," *IBM Technical Disclosure Bulletin*, vol. 24, No. 7A, Dec. 1981, W. Rausch et al., p. 3453.
Wolf, et al., Silicon Processing for the VLSI Era, vol. 1, 1986, Lattice Press. pp. 384-385, 294-308.
Greffken et al, "Contact Metallurgy Development . . . ", *IBM J. Research and Development*, vol. 31, No. 6, Nov. 1987, pp. 608-616.
Wolfer, et al., "Properties of Reactive Sputtered . . . ", *Solid State Technology*, Feb. 1986, pp. 131-136.
Rausch et al., "Palladium Silicide Contact . . . ", *IBM Tech. Disc. Bull.*, 24(7A), Dec. 1981, pp. 3453.
Bower, R., et al., "Formation Kinetics and Structure . . . ," *Solid State Electronics*, 1973, vol. 16, pp. 1461-1471.
Tu, K. N., "Selective growth of metal-rich . . . ," *Appl. Phys. Lett.*, vol. 27, No. 4, Aug. 15, 1975, pp. 221-224.
Nicollet, M., et al., "Formation and Characterization . . . " in VLSI Electronics. AP, pp. 346, 347, 458, 459.

*Primary Examiner*—T. N. Quach
*Attorney, Agent, or Firm*—Wenderoth, Lind & Ponack

[57] ABSTRACT

A metal semiconductor ohmic contact farming process consists of enrichment of the surface of the semiconductor on which contact is to be formed, by ion implantation of a dopant, followed by deposition of a metal film on the implanted surface and then by thermal annealing at a temperature lower than 500° C. and for a period shorter than 60 minutes.

5 Claims, 2 Drawing Sheets

5,302,549

METAL-SEMICONDUCTOR OHMIC CONTACT FORMING PROCESS

This application is a continuation of now abandoned application, Ser. No. 07/651,622, filed on Feb. 7, 1991 abandoned.

BACKGROUND OF THE INVENTION

This invention concerns a process for forming an M-S (Metal-Semconductor) ohmic contact on lightly doped regions, which consists in particular of enriching the surface of the semiconductor on which the contact is to be formed, by means of ion implantation of a dopant and subsequent annealing.

A basic requirement of the M-S ohmic contains which act as an interface between a semiconductor device and a metal terminal is that the not introduce appreciable voltage drops when the current passes through them, so as not to alter the electrical properties of the device itself.

One of the main factors on which the specific contact resistance of an M-S junction depends, consists of the concentration of electrically active dopant in the semiconductor, in correspondence with the M-S interface, and of the choice of metal used.

If, when forming an M-S ohmic contact, the concentration of dopant active on the surface of the semiconductor is not sufficiently high, the surface is enriched with dopant. The most widely used enriching methods consist of pre-deposition and ion implantation of the dopant.

The first method calls for very high temperatures (over 900° C.). With the second method, if the ion bombardment has produced a surface layer of amorphous material, it is necessary to carry out the subsequent annealing at a temperature higher than 500°–550° C. in the case of silicon, with a subsequent epitaxial regrowth in the solid phase ("SPE") of the damaged layer and activation of the implanted species. Whereas, if the ion bombardment has not caused amorphization, it is necessary to use a higher annealing temperature to activate the implanted species.

With both the first and the second method, the temperature at which the thermal processes are carried out is incompatible with the presence, on the front of the wafer, of metallization levels (for example, aluminum) or layers of organic material (for example, polymide).

SUMMARY OF THE INVENTION

The scope of this invention is to produce M-S contacts with ohmic characteristics on lightly doped semiconductor regions, by means of a contact surface enriching process with which it is possible to keep the temperature and the duration of the relative annealing within values which rule out the possibility of alteration of the structural/functional characteristics of the semiconductor and, in particular, of the devices on the front of the wafer.

The process according to the invention is characterized by the fact that the step of ion implantation of dopant on the surface of the semiconductor on which the ohmic contact is to be formed is followed by the deposition of a metal film on the same surface and then by an annealing process at a considerably lower temperature than 500° C. and for a considerably shorter period than 60 minutes.

BRIEF DESCRIPTION OF THE DRAWINGS

The characteristics of the process will be more clearly evident from the following description of a nonrestrictive exemplificative embodiment, with reference to the accompanying drawings, in which.

DESCRIPTION OF THE PREFERRED EMBODIMENTS

A process according to the invention comprises the following steps.

Step 1

The ion implant is carried out on the surface of the semiconductor in the areas on which the ohmic contact is to be formed, respecting the following conditions:

the species of dopant implanted must be of a kind that, once activated, has an electrical behavior homologous to that of the original silicon region;

the implantation energy must be sufficiently low as to limit the thickness of the amorphized zone and consequently the time required for the annealing; when implanting arsenic in silicon it is advisable not to exceed 30 KeV; starting, for example with an N type silicon region with a dopant concentration of $\leq 10^{17}$ atoms/cm$^3$ it is possible to implant arsenic at energy in the region of 10 KeV and with a dose of approximately $4 \cdot 10^{14}$ atoms/cm$^2$ (the dose of dopant to be introduced obviously depends upon the mass of the ion to be implanted and upon the concentration of dopant that one wishes to obtain).

Figure 1:
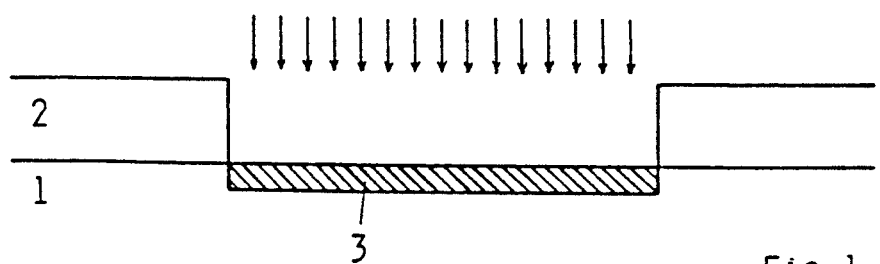
FIGS. 1–3: show the steps of a process according to the invention.

This step is illustrated in FIG. 1 in which reference numeral 1 denotes the semiconductor; reference numeral 2 denotes a dielectric layer on the surface of the semiconductor, and reference numeral 3 denotes the region amorphized as a result of the ion implantation.

Step 2

A metal film is deposited on the implanted surface. The metal is preferably chosen from among those which have the lowest barrier height for the semiconductor used. Referring to the example taken into consideration in step 1 (N type silicon region, etc.) a film of titanium of approximately 100 nm can be deposited.

Figure 2:
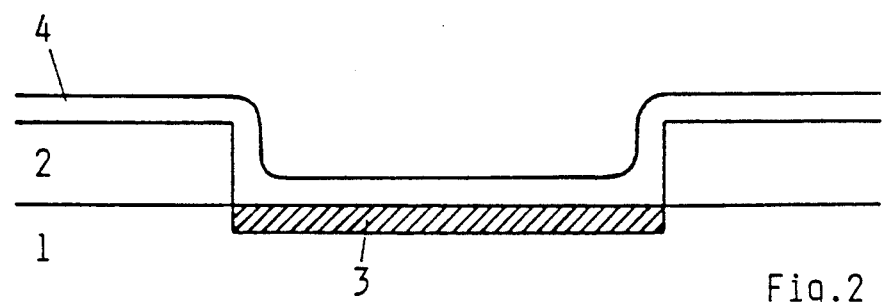

This step is illustrated in FIG. 2 in which reference numeral 4 denotes the metal film deposited.

Step 3

An annealing treatment is carried out at a temperature below 450° C. and for a period of less than 60 minutes (preferably not more than 30 minutes) under vacuum or in an inert atmosphere, with consequent regrowth of the amorphized zone and activation of the implanted species. Referring again to the example taken into consideration in the previous steps (N type silicon region, titanium film of approximately 100 nm) the annealing can be carried out at a temperature of 420° C. and for a period of 30 minutes.

Figure 3:
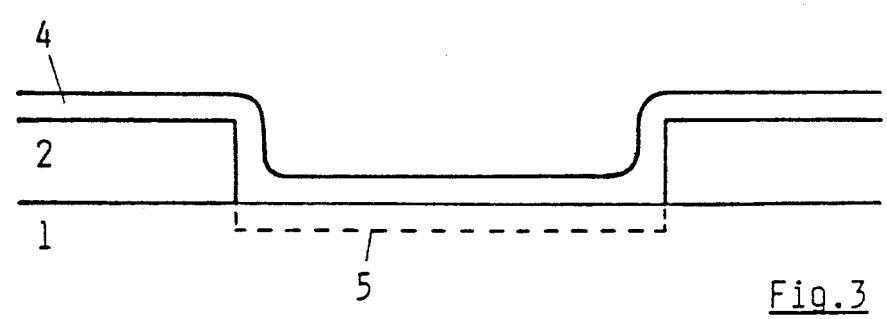

This step is illustrated in FIG. 3, in which reference numeral 5 denotes the recrystallized dopant enriched region formed after the annealing treatment.

With regard to step 1 it should be noted that by using limited implantation energies it is also possible, in addition to the advantage of a shorter annealing period, to obtain a concentration of the implanted species with a maximum peak closer to the surface and consequently a greater reduction of the specific resistance of the ohmic contact produced.

With regard to step 2, it should be noted that a possible explanation for the advantages achieved with the process according to the invention is that, in addition to producing the metallic electrode of the M-S contact, the deposition of the metal film carried out after the implantation and before the annealing treatment also has the important function of accelerating and considerably facilitating the regrowth of the previously amorphized crystal, when the system is heated (annealing process).

Results of tests carried out on specimens of silicon subjected to the process according to the invention showed both total regrowth of the amorphized crystal following the ion implantation, and satisfactory activation of the implanted species, as well as a specific M-S contact resistance of approximately $10^{-4}$ ohm.cm$^2$ and consequently more than a thousand times lower than the specific resistance of M-S ohmic contacts produced without enrichment.

Figure 4A:
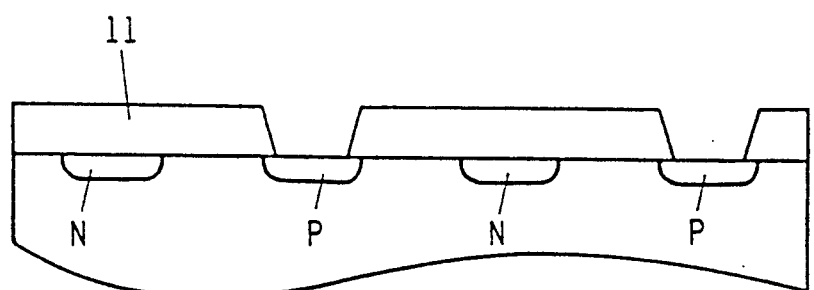
Figure 4B:
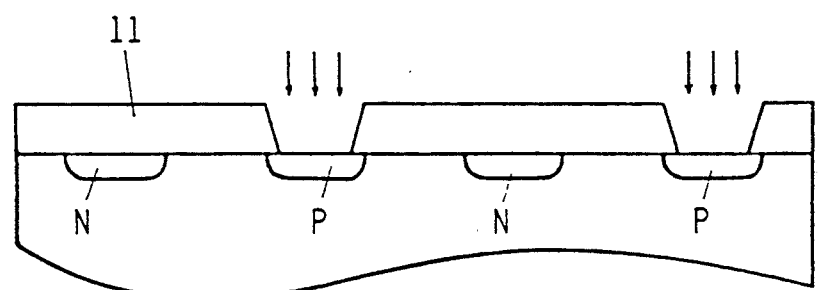
Figure 4C:
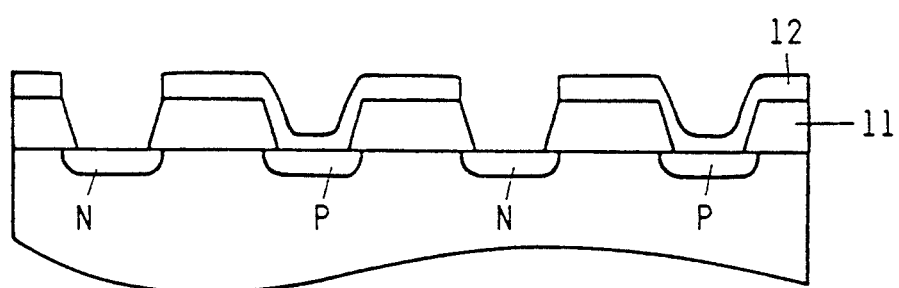
Figure 4D:
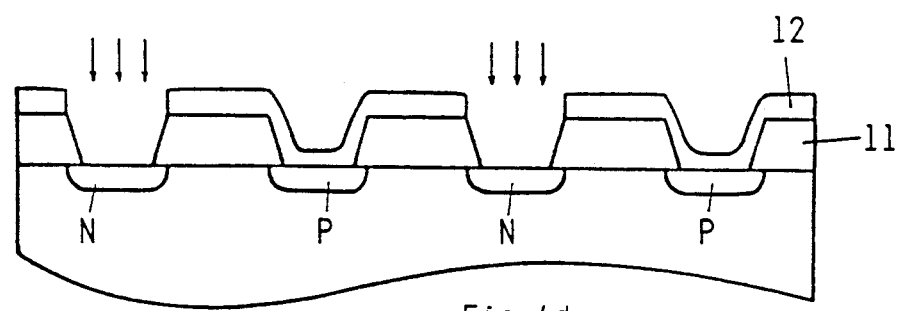
Figure 4E:
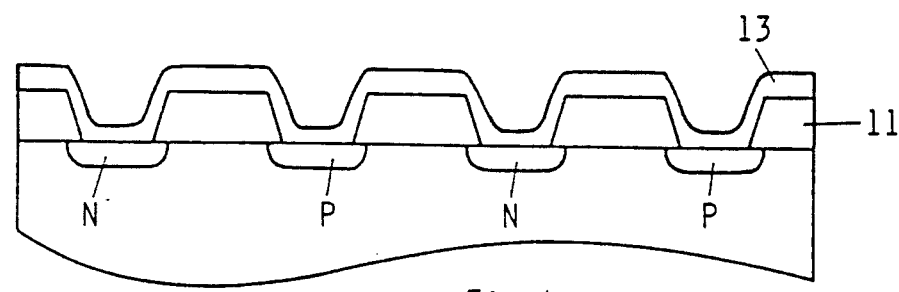

One possible application of the process under examination is that of the formation of contacts in VLSI technology (Very Large Scale Integration). This application, which is illustrated in FIGS. 4a–4e, can be carried out as follows:

opening of all the contacts of the same type (N or P) according to known photolithographic techniques (see FIG. 4a which shows the opening of all the P type contacts in the surface layer 11 of SiO$_2$);

ion implantation of dopant with electrical behavior homologous to that of the areas in which the apertures of the contacts have been made (FIG. 4b);

deposition of a layer 12 of resist and subsequent opening of the contacts of the opposite type to the first (FIG. 4c);

ion implantation of dopant with electrical behavior homologous to that of the areas in which the apertures of the aforesaid contacts of opposite type have been made (FIG. 4d);

removal of the layer of resist;

deposition of a layer of metal 13 (FIG. 4e);

annealing treatment (as described previously).

In addition to the advantages previously pointed out, the process of the example described above makes it possible:

to obtain a self-aligned enrichment of the surface of the active contact regions;

to replace the thermal process normally carried out, according to the known art, after the metallizing, with the final annealing.

Figure 5:
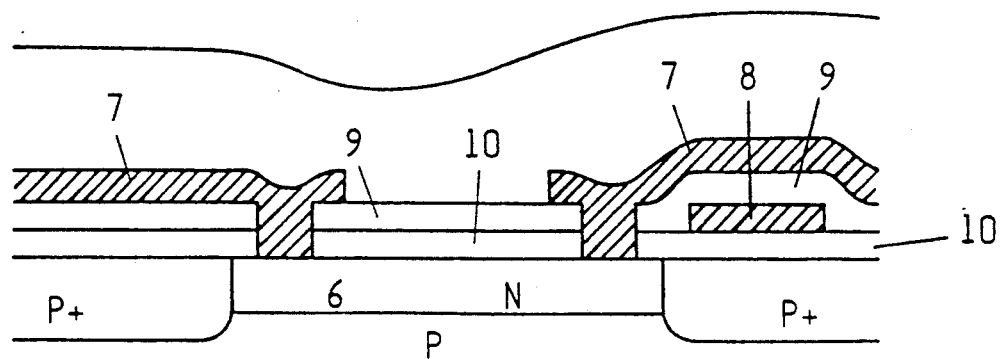
FIGS. 4a–4e and 5: show two examples of application of the process.

A further possible application of the process according to the invention is that of forming an ohmic contact between a second metallization level and a high-resistivity semiconductor structure. This application, which is illustrated in FIG. 5, can be carried out as follows.

A resistor 6, fabricated in an epitaxial layer, must be contacted by the second level 7 of metal.

To render the specific contact resistance negligible, by the known technique, it is necessary for the deposition of the first level 8 of metal to be preceded by the opening of the contacts on 6 (through the layer 10 of silicon dioxide) and by enrichment of the areas of contact by means of ion implantation followed by high-temperature annealing to activate the dopant; this is then followed by an annealing process, deposition of the first level 8 of metal, deposition of the second layer 9 of dielectric, further photolithography to re-open the contacts on 6, and lastly, deposition and photolithography of the second level 7 of metal.

Whereas, with the process according to the invention, it is possible to open the contacts on 6 and carry out the subsequent ion implantation after depositing the first level 8 of metal and the second layer 9 of dielectric. This is because the temperature and the length of time of the annealing which follows the metallizing of the contact areas are compatible with the presence of the first level 8 of metal and with the possible use of organic materials (for example polymide) to make the dielectric 9.

In this second possible application, the process according to the invention offers the following additional advantages:

the enriching process is self-aligned with the contact photolithography, which results in a reduction in the necessary space and better integration;

in the event of aluminum being used for constructing the second level 7 of metal, the annealing that follows the metallizing makes it unnecessary to carry out the "alloying" treatment normally used in the known technique in order to reduce the presence of native oxide between the semiconductor and the metallization.

We claim:

1. A process for forming a metal-semiconductor ohmic contact, which comprises the successive steps of:

enriching a surface of a semiconductor on which a contact is to be formed by implanting ions of a dopant to produce a surface layer of an amorphous semiconductor material, depositing a metal film on the implanted surface layer, and annealing the resulting surface layer at a temperature lower than 500° C. for less than 60 minutes, to cause an epitaxial regrowth of the amorphous semiconductor material, to cause an activation of the implanted dopant, and to obtain a semiconductor layer enriched with dopant on the interface of the metal and the semiconductor.

2. A metal semiconductor ohmic contact forming process as claimed in claim 1, wherein the semiconductor consists of silicon, the dopant consists of arsenic and the order of magnitude of the implantation energy is equal to or less than 30 KeV.

3. A metal semiconductor ohmic contact forming process as claimed in claim 2, characterized by the fact that the implantation energy is in the region of 10 KeV, the dose of arsenic is in the region of $4 \cdot 10^{14}$ atoms/cm$^2$, the deposited metal film is a film of titanium having a thickness of approximately 100 nm, and the annealing process is carried out at approximately 420° C. for approximately 30 minutes.

4. A metal semiconductor ohmic contact forming process as claimed in claim 1, applied to the forming of contacts in VLSI technology, comprising the following steps:

opening of all the contacts of the same first conductivity type according to known photolithographic techniques;

ion implantation of dopant with electrical behavior homologous to that of the areas in which the apertures of the contacts have been made;

deposition of a layer of resist and a subsequent opening of the contacts of the opposite conductivity type to that of the first conductivity type;

ion implantation of a dopant with electrical behavior homologous to that of the areas in which the apertures of the aforesaid contacts of opposite conductivity type have been made;

removal of the layer of resist;

deposition of a layer of metal;

5. A process as claimed in claim 1, applied to the forming of an ohmic contact between a second level of metal and a resistor made in a semiconductor structure, wherein the opening of the contacts on the resistor and the subsequent ion implantation are carried out after depositing a first level of metal and an overlying layer of dielectric and wherein the ion implantation, depositing of the second metallic layer and subsequent annealing, necessary for activation of the implanated species, are performed after creation of the first layer of metal which is final and is present during the process of formation of the ohmic contact.

* * * * *